United States Patent [19]

Baudry et al.

[11] 4,323,652
[45] Apr. 6, 1982

[54] STARTING MIXTURE FOR A DIELECTRIC COMPOSITION, SCREEN PRINTING PASTE HAVING SUCH A STARTING MIXTURE, AND PRODUCT OBTAINED

[75] Inventors: Hugues Baudry, Villecresnes; Claude Morhaim, Paris; Dominique Bricout, Evreux, all of France

[73] Assignee: U.S. Philips Corporation, New York, N.Y.

[21] Appl. No.: 130,282

[22] Filed: Mar. 14, 1980

[30] Foreign Application Priority Data

Mar. 23, 1979 [FR] France ............................ 7907355

[51] Int. Cl.³ .................. H01B 3/02; C03C 3/04; C03C 3/22; C04B 35/00
[52] U.S. Cl. .................................... 501/17; 501/5; 501/26; 501/32; 501/65; 501/67; 501/69; 501/70; 501/71; 501/72; 501/73; 501/79

[58] Field of Search ................. 106/39.6, 52, 48, 54; 252/63.2, 63.5; 501/32, 65, 67, 69, 70, 71, 72, 73, 79, 5, 17, 26

[56] References Cited

U.S. PATENT DOCUMENTS 4,152,282  5/1979  Baudry et al. .................... 106/39.6

Primary Examiner—Edward J. Meros
Assistant Examiner—Mark Bell
Attorney, Agent, or Firm—Norman N. Spain

[57] ABSTRACT

Dielectric composition, screen printing paste having such a composition and products obtained.

The invention describes a dielectric composition which may be used in particular as an insulating screen-printing paste, which is compatible with a copper-containing conductive screen-printed layer, the paste containing, dispersed in an organic vehicle, a mixture of ceramic phases, consisting essentially of zinc oxide and cobalt oxide, and a vitreous phase containing at least a glass which can be devitrified by dissolving the zinc oxide.

6 Claims, 4 Drawing Figures

STARTING MIXTURE FOR A DIELECTRIC COMPOSITION, SCREEN PRINTING PASTE HAVING SUCH A STARTING MIXTURE, AND PRODUCT OBTAINED

The invention relates to a starting mixture for a dielectric composition having at least a vitreous phase and a ceramic phase and the quantities by volume of the vitreous phase being between 85 and 60% and of the ceramic phase (S) between 15 and 40%, the vitreous phase being a zinc silicate and an alkaline earth silicate. The invention is used in the field of micro-electronics, particularly in the production of passive components and passive circuits and thick film technology.

Such starting mixtures for dielectric compositions are known from the prior art, particularly from U.S. Pat. No. 4,152,282 which contains a glass of the short, non-spontaneously devitrifiable type as the vitreous phase, and aluminum oxide as the ceramic phase. These mixtures, which are used as screen printing paste after dispersion in an organic vehicle have considerable advantages over other pastes offered by competitive firms, notably in that, in the case of multilayer deposition the successive firing operations in a nitrogen atmosphere do not cause undesired flow or a degradation of the electrical properties of the layer. However, improvements are desired on the one hand in regards to the decrease of the carbonaceous residues present in the said layer, on the other hand the compactness of the layer to enable screen printing of high-grade layers.

The first-mentioned drawback has been solved by the method described in the Applicants U.S. Patent application Ser. No. 72,945 not yet published which describes metal oxides which are added in a quantity by volume of between 1 and 10%, notably praseodimium oxide ($Pr_6O_{11}$, $PrO_2$) or cerium oxide, in order to remove those contaminating carbonaceous residues which were the result, for example of the absorption of the organic vehicle by the aluminum oxide powder. However, the complete removal of the carbonaceous residues would require relatively large fractions of the said additives.

The present invention has for its object to mitigate the above-mentioned drawbacks, by means of an insulating screen printing paste which must be cured in a nitrogen atmosphere and which is therefore compatible with previous pastes protected by Applicants, by means of which it is possible to obtain compact non-contaminated layers after firing.

According to the present invention the starting mixture for the dielectric composition is therefore characterized in that at least one of the ceramic phases consists of zinc oxide. In the following description by "the ceramic phase", we mean also a mixture of ceramic phases, for example a mixture of zinc oxide, cobalt oxide and praseodimium oxide.

As, the surface activity of this ceramic phase is less than that of the pulverized aluminum oxide it therefore absorbs the organic fraction to a lesser extent, whereas furthermore the transition of the zinc oxide from the ceramic phase to the vitreous phase, with the purpose of devitrifying said phase, depends to a lesser extent on the granulation of the powders, and the addition of an oxidizing agent which can eliminate the carbonaceous residues as described in French Patent Application Ser. No. 78 25 860 can therefore be limited to very small quantities, for example to 0,5 to 5% by volume.

In accordance with an embodiment of the invention, the starting mixture for a dielectric composition is characterized in that the vitreous phase is constituted by 30-55 mole % $SiO_2$, 20-40 mole % ZnO, 0-20 mole % $B_2O_3$, 0-10 mole % $Al_2O_3$, 5-40 mole % CaO+SrO+BaO, and possibly, 0-10 mole % CoO as colouring oxide.

In accordance with a preferred embodiment, the molar percentages are equal to 50% $SiO_2$, 20% ZnO, 5% $B_2O_3$ 5% $Al_2O_3$, 15% BaO and 5% CoO as colouring oxide.

This type of, the glass is very suitable for firing in nitrogen. Additionally the greater ease in carrying out the proceeding reaction with zinc oxide allows the choice of a glass which has a higher softening point and is more viscous than when aluminum oxide is chosen, which, on the one hand renders it possible for the oxidizing agent to fulfil its function more satisfactorily and, on the other hand results in a better definition, after firing, of the screen-printed patterns.

In accordance with a variant of the invention, the starting mixture for the dielectric composition is characterized in that the vitreous phase consists of a mixture of glasses one of which is spontaneously devitrifiable.

Experiments have shown that, in this manner, the layer obtained after firing is more compact and the subsequent screen printing of the upper layers is improved to a great extent. In accordance with a second variant of the invention, the starting mixture for the dielectric composition is characterized in that it contains several ceramic phases, the first one being zinc oxide and a second ceramic phase being cobalt oxide.

By means of the following description, which is given by way of non-limitative example with reference to the accompanying drawings, it will be better understood how the invention can be put into effect.

Figure 1A:
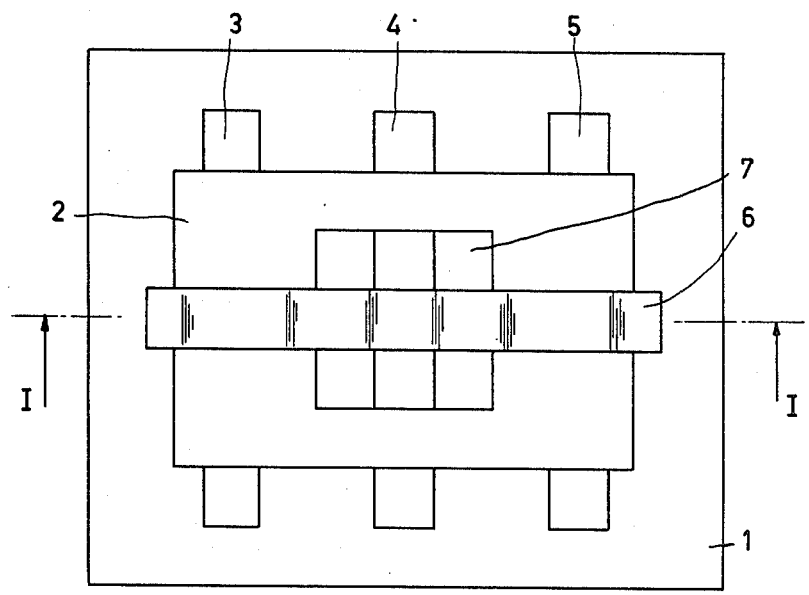
FIG. 1a is a plan view of a multi-layer screen-printed structure on a substrate which is typical of aluminum oxide and FIG. 1b is a sectional view along the line I—I.

Dielectric compositions for the subsequent preparation of screen-printing paste and which generally comprise a vitreous and a ceramic phase in quantities by volume which are relatively large, comprising between 70% and 40% for the vitreous phase and between 30% and 60% for the ceramic phase are known already.

The above-mentioned U.S. Pat. No. 4,152,282 discloses a starting mixture for a dielectric composition which is compatible with the system of pastes developed by Applicants on the basis of a copper-containing paste which requires a firing operation in a non-oxidizing atmosphere and the vitreous phase of which is a glass of the short type, more particularly a zinc borosilicate, and the ceramic phase an aluminum oxide.

The novelty of the present invention resides in the fact that it uses zinc oxide as the ceramic phase, or a mixture of zinc oxide and cobalt oxide, whereas the composition of the glass is somewhat different, particularly in that the softening point and the viscosity are considerably higher.

The following table gives a survey of these novel composition.

| Composition | Basic vitrifiable composition mole % | Basic vitrifiable composition preferred composition | Additional composition spontaneously di-vitrifiable composition |
|---|---|---|---|
| $SiO_2$ | 30-55% | 50% | 48% |
| ZnO | 20-40% | 20% | 29% |
| $B_2O_3$ | 0-20% | 5% | — |
| $Al_2O_3$ | 0-10% | 5% | — |
| BaO + CaO + SrO | 5-40% | 15% BaO | 23% CaO |
| CoO | 0-10% | 5% | — |
| $\rho(kg/m^3)$ | | 3 532 | 3 403 |
| $10^7 \cdot \alpha(°C.^{-1})$ | | 64,8 | 64,6 |
| ann. p. (°C.) | | 617° C. | 640° C. |
| sof. p. (°C.) | | 650° C. | 663° C. |

This table also shows, in addition to the composition, the density in $kg/m^3$, the coefficient of expansion between 20° and 320° C., the annealing point (ann.p.) in °C. and the dilatometric softening point (sof.p.) in °C.

In accordance with the present invention there is provided a glass in molar quantities within the ranges indicated in the Table, a preferred composition being a composition shown in the second column. This glass or one of the glasses within the range may be mixed with a vitreous composition of the same family (zinc and alkaline earth silicate) but which, by its composition, appeared to be subjected to spontaneous devitrification (third column) in the test conditions (glass frit subjected to remelting). The starting mixture for the dielectric composition of the invention is obtained by intimately mixing the glass frit thus obtained with a ceramic powder, in quantities by volume between 85 and 60% for the vitreous phase and between 15 and 40% for the ceramic phase, respectively. Preferably, a quantity by volume of 78% for the vitreous phase and for the ceramic phase of 22% (11% ZnO, 7% CoO and 4% $PrO_2$) is chosen, the best possible results being obtainable with these quantities both as regards the mechanical behaviour and as regards the electric behaviour of the layer obtained therefrom.

The screen-printing pastes according to the invention are obtained by dispersing the starting mixture for the dielectric compositions in an organic vehicle suitable for screen-printing. A solution of ethyl cellulose in terpineol or a mixture on the basis of terpineol is frequently used for this purpose. Before firing, the organic vehicle may represent 10-40% by weight of the screen-printing paste, the vehicle and its proportion being chosen in dependence on the desired rheological behaviour.

Figure 1B:
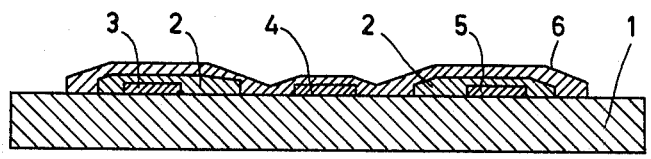

The paste is then passed through a silk-screen in such a manner that a multilayer pattern 2 as, for example, shown in the accompanying FIG. 1 is obtained on a substrate which is typically of aluminium oxide 1, a plan view of this pattern being shown in FIG. 1a and a sectional view along the line I—I in FIG. 1b. This pattern 2, which has been obtained with the starting mixture for the dielectric composition according to the invention is placed between three lower conductors 3, 4 and 5 and an upper conductor 6 and insulates this conductor 6 from the conductors 3 and 5 whereas, owing to the recessed portion 7, it renders it possible to establish a connection between the conductors 4 and 5.

Figure 2:
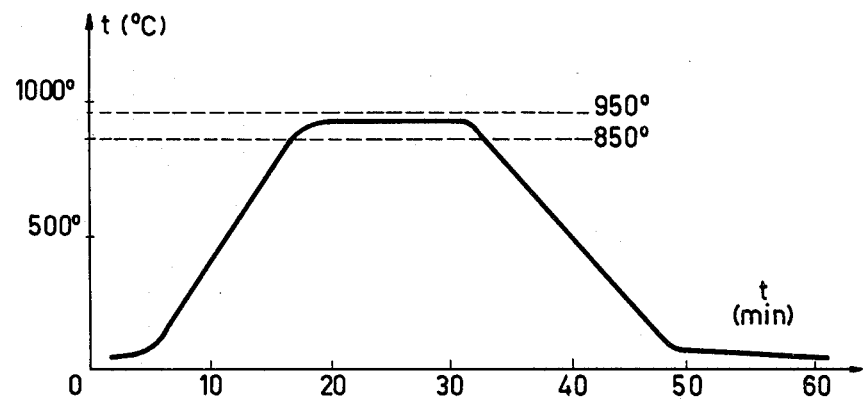
FIG. 2 shows graphically a firing cycle plotted versus the time of a screen-printed layer.

The layer provided by this pattern is fired in a nitrogen atmosphere, in a temperature range between 850° and 950° in accordance with a cycle as shown in FIG. 2, which shows, on the abscissa, the duration of this firing operation (approximately 1 hour) with a plateau of approximately 10 minutes, and the temperature on the vertical line.

Figure 3:
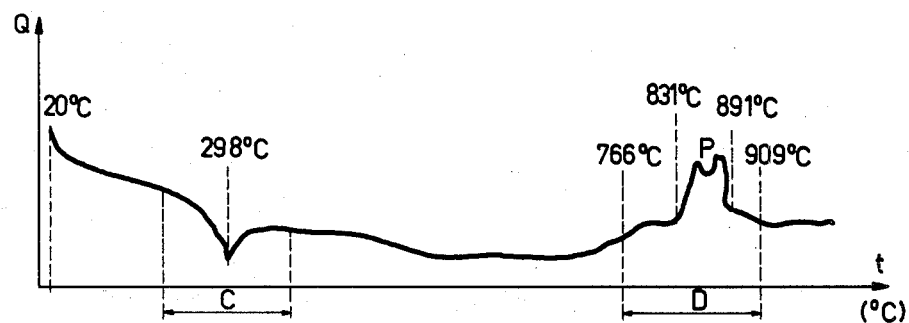
FIG. 3 shows an example of a differential thermal analysis diagram.

The temperature range of the firing operation must be chosen so that at least the devitrification zone is reached, which zone can be derived from the differential thermal analysis graph of the relevant mixture, the general variation of which is shown diagrammatically in FIG. 3 (this Figure shows the devitrification zone D, as well as the decomposition zone of the oxidizing agent C). In a simplified manner the abscissa of this graph shows the temperatures and the ordinate the quantities of heat Q in arbitrary units. As the devitrification is the transition of a disordered structure to an ordered structure, it is accompanied by a heat discharge (exothermal reaction), and the curve shows a wide positive peak, denoted by P in FIG. 3. Furthermore, this peak is split into two distinct sub-peaks which correspond on the one hand with the reaction between the glass (preferred composition) and the zinc oxide and on the other hand with the crystallisation of the spontaneously devitrifiable composition; the width of the peak P corresponds with the devitrification zone.

Applicants have effected accurate electrical measurements on the insulating layer of the preferred composition obtained in accordance with the invention, to determine its dielectric properties, which measurements are summarized in the following Table.

| Measurements | Frequency |
|---|---|
| $\epsilon =$ | 7 |
| $10^3 \times tg\delta$ | 2-5 from 10 kHz to 1MHz |

This layer has a resistance higher than $10^{10}\Omega$ measured on a surface of 1 $cm^2$ and a thickness of 40$\mu$m at a voltage of 50 V. No porosity whatsoever was detected with the conventional means (liquid diffusion, cooling..).

From accurate crystallographic analysis of the layer it was possible to determine the principal crystalline phases which were formed during the firing operation. By dissolving the oxides in the initially vitreous phase, this phase devitrifies, which results in one crystalline phase or more crystalline phases, which strengthen the structure of the dielectric layer and which become larger during the successive firing operations. It means that in this manner willemite ($Zn_2SiO_4$: orthosilicate of zinc) and hardystonite ($ZnCa_2Si_2O_7$: zinc calcium silicate) have been formed, in which the calcium may alternatively be replaced by barium.

Other dielectric compositions have also been investigated but they did not furnish better results. It should, however, be understood that numerous variations are possible within the described composition ranges, or in the embodiments of circuits for which a dielectric composition according to the invention is used, or in equivalent substituents, without passing beyond the scope of the present invention as claimed in the following claims.

What is claimed is:

1. A composition suitable for forming a dielectric composition consisting essentially of 85 to 60% by volume of a vitreous phase and 15 to 40% by volume of a ceramic phase, said ceramic phase consisting essentially of zinc oxide or of a mixture of zinc oxide and cobalt oxide and said vitreous phase having the following composition by mol percent: 30-50% $SiO_2$, 20-40% ZnO, 0-20% $B_2O_3$, 0-10% $Al_2O_3$, 5-40% CaO+SrO+BaO and, as a coloring oxide, 0-10% of CoO.

2. The composition of claim 1, characterized in that the vitreous phase in molar quantities is composed of 50% $SiO_2$, 20% ZnO, 5% $B_2O_3$, 5% $Al_2O_3$, 15% BaO and 5% CoO.

3. The composition of claim 1 characterized in that the vitreous phase consists of a mixture of glasses at least one glass of which is spontaneously devitrifiable.

4. The composition of claim 3 characterized in that the spontaneously devitrifiable glass containing the following compositions in mol percent: 48% $SiO_2$, 29% ZnO and 23% CaO.

5. The composition of any of claims 2 and 1-4 characterized in that it consists of 22% by volume of the ceramic phase and 78% by volume of the vitreous phase.

6. The composition of claims 1 or 4, characterized in that cobalt oxide is present in the ceramic phase.

* * * * *

UNITED STATES PATENT AND TRADEMARK OFFICE
CERTIFICATE OF CORRECTION

PATENT NO. : 4,323,652
DATED : April 6, 1982
INVENTOR(S) : HUGUES BAUDRY ET AL

It is certified that error appears in the above—identified patent and that said Letters Patent is hereby corrected as shown below:

Column 4, Line 66 "50%" should be
--55%--.

Column 6, Line 3, "1-4" should be
--1,3 and 4--.

Signed and Sealed this

Ninth Day of August 1983

[SEAL]

Attest:

GERALD J. MOSSINGHOFF

Attesting Officer     Commissioner of Patents and Trademarks